United States Patent
Wang et al.

(10) Patent No.: US 8,866,384 B2
(45) Date of Patent: Oct. 21, 2014

(54) OLED DISPLAY

(71) Applicant: InnoLux Corporation, Miao-Li County (TW)

(72) Inventors: Shih-Chang Wang, Miao-Li County (TW); Hsiang-Lun Hsu, Miao-Li County (TW); Dai-Liang Ting, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 13/804,843

(22) Filed: Mar. 14, 2013

(65) Prior Publication Data

US 2013/0307407 A1    Nov. 21, 2013

(30) Foreign Application Priority Data

May 15, 2012    (TW) .............................. 101117177 A

(51) Int. Cl.

| | | |
|---|---|---|
| H01J 1/62 | (2006.01) | |
| H01J 63/04 | (2006.01) | |
| H01L 51/52 | (2006.01) | |
| H05B 33/04 | (2006.01) | |
| H01L 51/00 | (2006.01) | |
| H01L 27/32 | (2006.01) | |

(52) U.S. Cl.
CPC ............ *H05B 33/04* (2013.01); *H01L 51/5246* (2013.01); *H01L 51/525* (2013.01); *H01L 51/0024* (2013.01); *H01L 27/322* (2013.01)
USPC .......................................... 313/512; 313/504

(58) Field of Classification Search
USPC ..................................... 313/504, 512
See application file for complete search history.

(56) References Cited

U.S. PATENT DOCUMENTS

| | | | | |
|---|---|---|---|---|
| 6,605,826 | B2 * | 8/2003 | Yamazaki et al. | 257/72 |
| 7,193,366 | B2 * | 3/2007 | Tomimatsu et al. | 313/512 |
| 7,486,368 | B2 * | 2/2009 | Sakakura et al. | 349/153 |
| 7,671,959 | B2 * | 3/2010 | Koo et al. | 349/153 |
| 7,675,229 | B2 * | 3/2010 | Yuki | 313/505 |
| 7,880,382 | B2 * | 2/2011 | Nakamura | 313/512 |
| 8,063,561 | B2 * | 11/2011 | Choi et al. | 313/512 |
| 8,093,512 | B2 * | 1/2012 | Chen et al. | 174/523 |
| 8,390,194 | B2 * | 3/2013 | Choi | 313/512 |
| 8,415,880 | B2 * | 4/2013 | Choi et al. | 313/512 |
| 2004/0150319 | A1 * | 8/2004 | Tomimatsu et al. | 313/495 |
| 2004/0263740 | A1 * | 12/2004 | Sakakura et al. | 349/138 |
| 2005/0140290 | A1 * | 6/2005 | Park et al. | 313/512 |
| 2006/0135029 | A1 * | 6/2006 | Harada | 445/25 |
| 2007/0172971 | A1 * | 7/2007 | Boroson | 438/26 |
| 2007/0210702 | A1 * | 9/2007 | Nakamura | 313/504 |
| 2010/0258346 | A1 * | 10/2010 | Chen et al. | 174/521 |
| 2011/0242792 | A1 * | 10/2011 | Choi | 362/97.1 |

* cited by examiner

*Primary Examiner* — Thomas A Hollweg

(74) *Attorney, Agent, or Firm* — McClure, Qualey & Rodack, LLP

(57) ABSTRACT

An OLED display is provided, which includes a first substrate, a second substrate, a first micro-structure layer, a second micro-structure layer and an OLED. The second substrate is disposed opposite to the first substrate. The OLED is disposed at the second substrate. The first micro-structure layer is located between the first and second substrates and includes a plurality first protrusions are disposed in positions corresponding to a peripheral region of the first substrate. The second micro-structure layer includes a plurality of second protrusions, wherein the first and second protrusions are arranged alternatively.

12 Claims, 8 Drawing Sheets

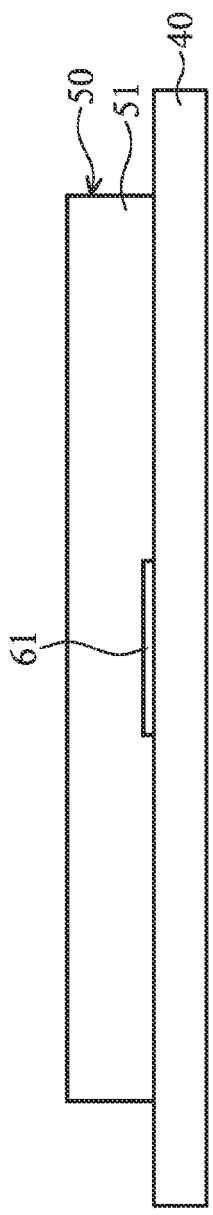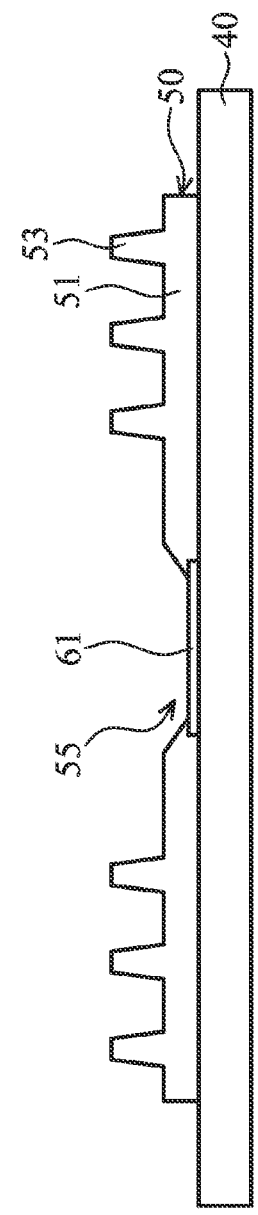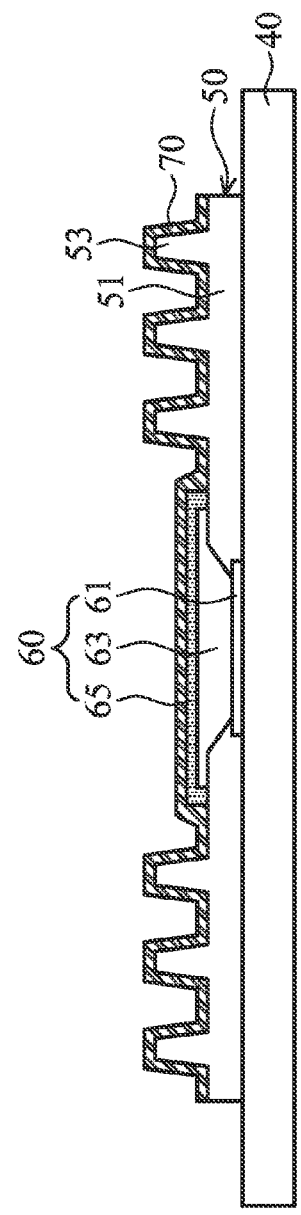

OLED DISPLAY

CROSS REFERENCE TO RELATED APPLICATIONS

This Application claims priority of Taiwan Patent Application No. 101117177, filed on May 15, 2012, the entirety of which is incorporated by reference herein.

BACKGROUND

1. Field of the Invention

The disclosure relates to an OLED display, and in particular relates to an OLED display having a low water/oxygen vapor transmission rate (WVTR/OTR).

2. Description of the Related Art

An organic light emitting diode (OLED) refers to a semiconductor device which is capable of converting electric energy into light energy and has advantages of self-luminescence, slimness, high contrast, short response time (within a few microseconds), wide viewing angles, low power consumption, wide working temperature ranges, panel flexibility, and so forth. Hence, the OLED is frequently applied to a number of electronic products.

However, performance of the OLED decays by moisture and oxygen, and therefore it is necessary to further package the OLED to prevent entry of moisture and oxygen. FIG. 1 shows a schematic view showing a packaging process of a conventional OLED display, wherein environmental substances P (such as moisture, oxygen or dust) may enter a region between a first substrate 110 and a second substrate 120, generally connected by a glass frit sealing 130, and deteriorate the OLEDs deployed therein. To address this issue, the whole OLED display is baked at a high-temperature environment and the glass frit sealing 130 is hardened by a laser device. However, the laser device is expensive and therefore, it is necessary to provide another OLED display to reduce the manufacturing cost.

Brief Summary Of The Invention

In light of the foregoing, one of the objectives of the present invention is to provide an OLED display with better moisture and oxygen blocking ability. Another objective of the present invention is to provide an OLED display which can be fabricated by a low-cost process.

In one exemplary embodiment, the OLED display includes a first substrate, a second substrate, a first micro-structure layer, a second micro-structure layer and an OLED. The second substrate is disposed opposite to the first substrate. The OLED display is disposed at the second substrate. The first micro-structure layer is disposed between the first and second substrates and includes a plurality of first protrusions, wherein the plurality first protrusions are disposed in a positions corresponding to a peripheral region of the first substrate. The second micro-structure layer includes a plurality of second protrusions, wherein the first and second protrusions are arranged alternatively.

In the embodiment, environmental substances enter the region surrounded by the first protrusions by passing through slits formed between the first and second protrusions.

In the embodiment, the first and second protrusions respectively protrude from the first and second substrates and each has a tapered shape. Namely, the cross section of the first and second protrusions near the first and second substrates is larger than that of the first and second protrusions further away from the first and second substrates. The environmental substances enter the region surrounded by the first protrusions by passing through outer surfaces of the first protrusions and the second protrusions. An acute angle formed between the lateral side of each of the first protrusions and the bottom side of the corresponding first protrusion, is less than 70 degrees. Additionally, an acute angle formed between the lateral side of each of the second protrusions and the bottom side of the corresponding second protrusion, is less than 70 degrees.

In the embodiment, a maximum width of each the first and second protrusions is ranged from 5 μm to 25 μm. A pitch between each two of the adjacent first protrusions is ranged from 10 μm to 30 μm, and a pitch between each two of the adjacent second protrusions is ranged from 10 μm to 30 μm.

In the other embodiment, the OLED display further includes a passivation layer formed on the second micro-structure layer and on the OLED.

In the other embodiment, the OLED display further includes a sealant, connected between the first and second substrates, wherein the peripheral region of the first substrate is located at the inner side of the sealant. Specifically, the peripheral region of the first substrate comprises an area inwardly extending for a predetermined distance from a position at which the sealant is connected to the first substrate, wherein the predetermined distance is ranged from 0.5 cm to 1 cm.

In the other embodiment, the OLED display includes a plurality of OLEDs and a color filter, and the second micro-structure further includes a plurality of pixel defined areas surrounded by the second protrusions, wherein the OLEDs are disposed in the respective pixel defined areas, and the color filter is disposed on the inner surface of the first substrate corresponding to the display area.

BRIEF DESCRIPTION OF THE DRAWINGS

The disclosure is more fully understood by reading the subsequent detailed description and examples with references made to the accompanying drawings, wherein:

FIGS. 4A, 4B, and 4C show fabrication processes of a second substrate, a second micro-structure, OLEDs, and a passivation layer.

DETAILED DESCRIPTION

The following description is one of the embodiments of carrying out the invention. This description is made for the purpose of illustrating the general principles of the invention and should not be taken in a limiting sense. The scope of the invention is best determined by reference to the appended claims.

Figure 1:
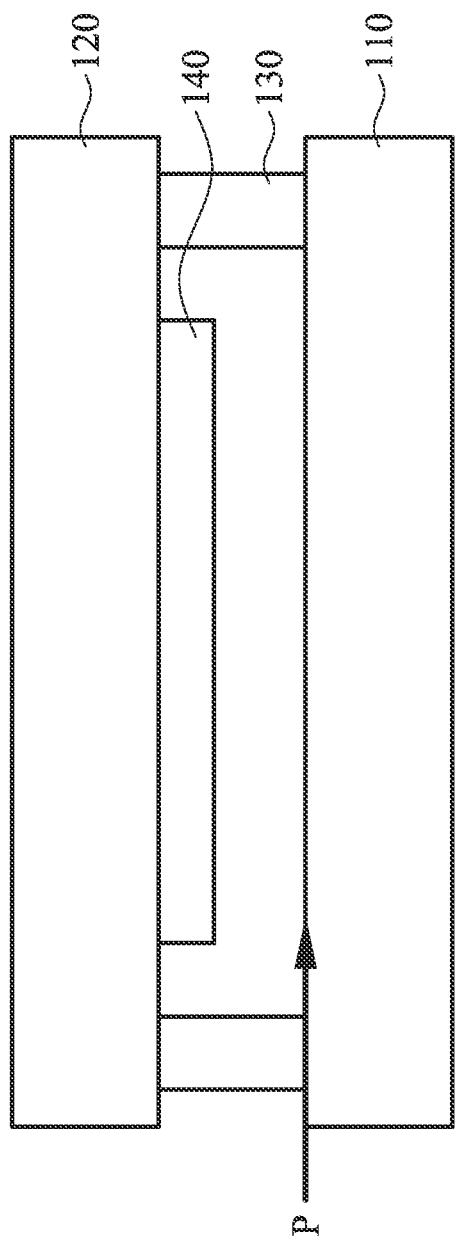
FIG. 1 shows a cross-sectional view of a prior art OLED display.
Figure 2:
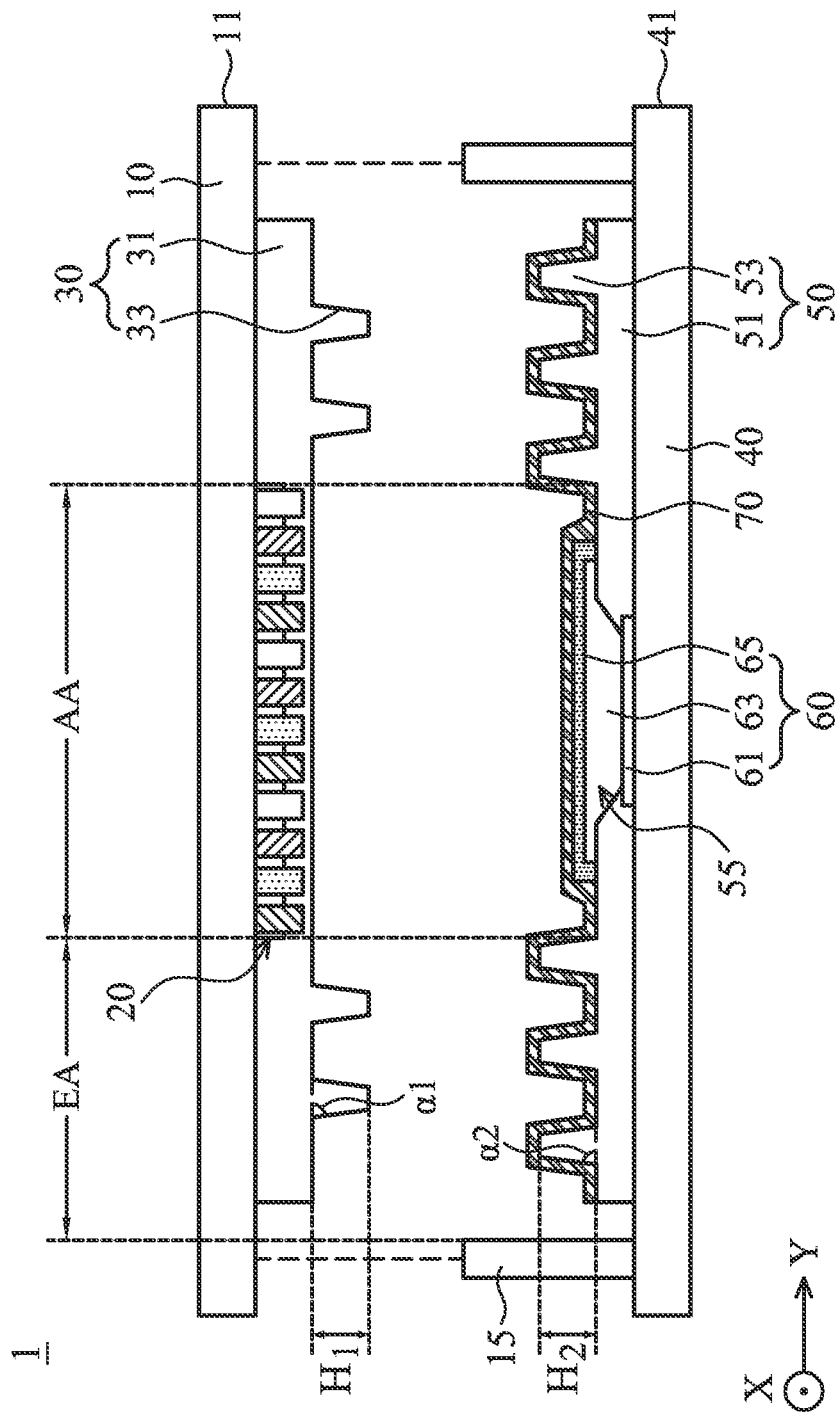
FIG. 2 shows a cross-sectional view of an OLED display in accordance with one preferred embodiment of the present invention.

Referring to FIG. 2, an explosive view of an OLED display 1 in accordance with an embodiment of the presented invention is shown. The OLED display 1 in accordance with the embodiment of the presented invention includes a first substrate 10, a sealant 15, a color filter 20, a first micro-structure layer 30, a second substrate 40, a second micro-structure layer 50, a plurality of OLEDs 60 and a passivation layer 70.

The first substrate 10 is a transparent glass plate, with a display area AA and a peripheral region EA surrounding the display area AA. The sealant 15, adjacent to the lateral side 11 of the first substrate 10, is connected between the first substrate 10 and the second substrate 40, wherein the peripheral region EA of the first substrate 10 is located at the inner side of the sealant 15. Specifically, the peripheral region EA includes an area inwardly extending for a predetermined distance from a position at which the sealant 15 is connected to the first substrate 10. In one non-limiting exemplary embodiment, the predetermined distance is between a range from 0.5 cm to 1 cm. The sealant 15 may consist of materials having favorable barrier properties such as Epoxy or silicon based materials. The WVTR/OTR of the sealant 15 is preferably 20g/$M^2$-day or less.

The color filter 20 is disposed on the inner surface of the first substrate 10 corresponding to the display area AA. The first micro-structure layer 30 is disposed on the color filter 20 and includes an overcoat layer 31 and a plurality of first protrusions 33, wherein the first protrusions 33 are disposed on the surface of the overcoat layer 31 that is corresponding to the peripheral region EA of the first substrate 10. Specifically, each of the first protrusions 33 protrudes from the overcoat layer 31 with a first height $H_1$ in a direction away from the first substrate 10. Additionally, because the cross section of each of the first protrusions 33 decreases along an extending direction thereof, an acute angle $\alpha_1$ is formed between the lateral surface of each first protrusion 33 and its bottom surface. In one exemplary embodiment, the height $H_1$ is between a range from 1.5 μm to 7 μm, and the acute angle $\alpha_1$ is less than 70 degrees. The width of the first protrusions 33 and the arrangement method of the first protrusions 33 will be elaborated in the descriptions referring to FIG. 5A.

In the embodiment, the color filter 20 is configured to transfer the color of light emitted from the OLEDs 60. However, in another embodiment, if the OLED layer emits primary colors of light, such as red, green and blue (RGB) or any other color of light, the second substrate 40 may also simply be a dummy glass (not shown in the figure) without a color filter formed thereon.

The second substrate 40 is a transparent glass plate disposed opposite to the first substrate 10. The second micro-structure layer 50 is formed on the inner surface of the second substrate 40, wherein the second micro-structure layer 50 includes a plurality of second protrusions 53 and a plurality of pixel defined areas 55 (for the sake of simplicity, only one pixel defined area 55 is shown in FIG. 2).

Each second protrusion 53 is formed on a pixel defined layer 51 of the second micro-structure layer 50 corresponds to a space between each two of the adjacent first protrusions 33 whereby the first protrusions 33 and second protrusions 53 are alternatively arranged. That is, all of the first protrusions 33 and all of the second protrusions 53 are disposed at the peripheral region EA. Each second protrusion 53 protrudes from the pixel defined layer 51 with a height $H_2$ in a direction away from the second substrate 40 and has a tapered shape.

Additionally, because the cross sectional area of each of the second protrusions 53 decreases along the extending direction thereof, an acute angle $\alpha_2$ is formed between the lateral surface of the second protrusions 53 and its bottom surface. In one exemplary embodiment, the height $H_2$ is between a range from 1.5 μm to 7 μm, and the acute angle $\alpha_2$ is less than 70 degrees. In the embodiment, the height $H_1$ is equal to the height $H_2$, but it should not be limited thereto. The height $H_1$ may be larger or less than the height $H_2$, if the height $H_1$ is compatible with the height $H_2$.

The pixel defined areas 55 are formed in a region of the second micro-structure layer 50 corresponding to the display area AA, and the OLEDs 60 are disposed in the respective pixel defined areas 55. That is, the pixel defined areas 55 and the OLEDs 60 are disposed on a region of the first substrate 10 corresponding to the color filter 20. Each of the OLEDs 60 includes a first electrode 61, a light-emitting layer 63 and a second electrode 65, wherein the substance in the light-emitting layer 63 is capable of emitting white light in response to the voltage difference between the first and second electrodes 63 and 65. The light emitted from the OLEDs should not be limited to white light. In another embodiment, the OLEDs 60 may produce primary colors of light, such as red, green and blue (RGB) or any other color of light. The passivation layer 70 is disposed on the second micro-structure layer 50 and the OLEDs 60, wherein the passivation layer 70 may be formed of SiNx, SiOx, or Al2O3, ZrO2, ZnO, HfO2 or metal oxide, SiC, TiN or a combination thereof.

The fabrication method of the OLED display 1 of the preferred embodiment of the invention will be discussed in detail hereafter.

Figure 3A:
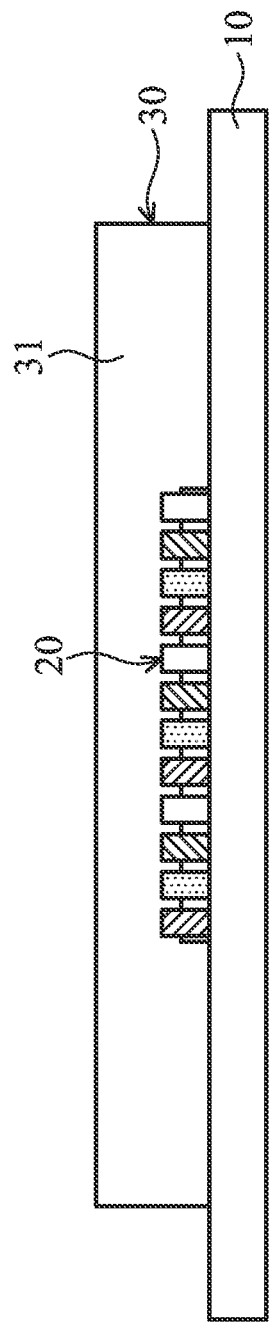
FIGS. 3A and 3B show fabrication processes of a first substrate, a color filter, and a first micro-structure.
Figure 3B:
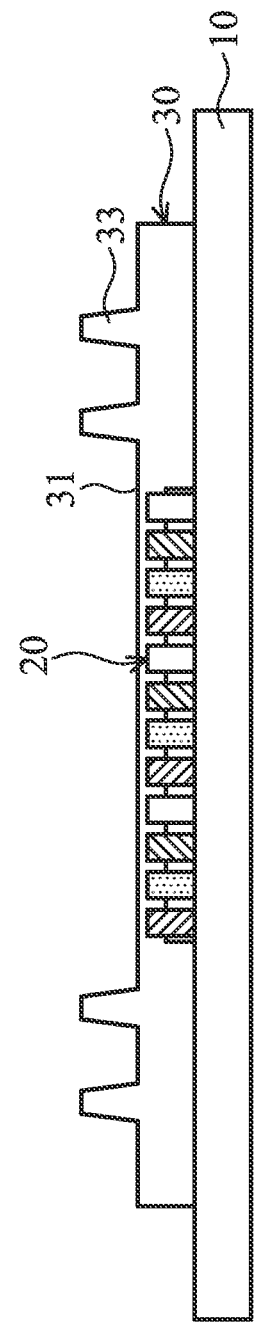

Referring to FIGS. 3A and 3B. In the beginning, as shown in FIG. 3A, a first substrate 10 is provided, and a color filter 20 is formed on the first substrate 10, and an overcoat layer 31 is disposed on the color filter 20. Next, as shown in FIG. 3B, a first micro-structure layer 30 is formed by a half tone photolithography process, etching process, or the first micro-structure layer 30 is superimposed on the first substrate 10. The first micro-structure layer 30 includes a plurality of first protrusions 33 disposed on the overcoat layer 31. Note that the first protrusions 33 and the upper surface of the overcoat layer 31 which is disposed on the color filter 20 are situated on different horizontal levels.

Referring to FIGS. 4A, 4B and 4C, on the other hand, a second substrate 40 is provided, as shown in FIG. 4A, and a plurality of electrodes 61 (only one electrode 61 is shown in FIGS. 4A, 4B and 4C) are formed thereon, and a pixel defined layer 51 is disposed on the first electrodes 61. Next, as shown in FIG. 4B, a plurality of second protrusions 53 and a plurality of pixel defined areas 55 surrounded by the second protrusions 53 are formed by a half tone photolithography process, wherein the second protrusions 53 and the upper surface of the pixel defined layer 51 are situated on different horizontal levels, but it should not be limited thereto. The second protrusions 53 and the upper surface of the pixel defined layer 51 may be on the same horizontal level, if the height and the arranged positions of first protrusions 33 are compatible with the second protrusions 53. Next, OLEDs 60 (only one OLED 60 is shown in FIGS. 4A, 4B and 4C) are formed in the pixel defined areas 55, and the multilayer passivation layer 70 is deposited by low temperature CVD and ALD techniques to dispose the OLEDs 60 and the second protrusions 53.

Figure 5A:
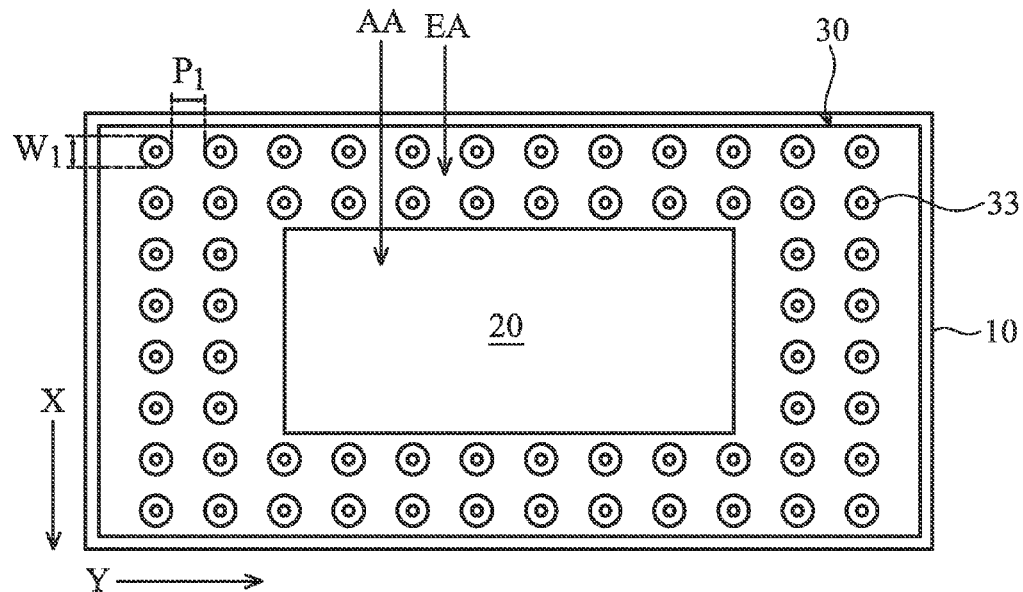
FIG. 5A shows a top view of partial elements of the OLED display of FIG. 2 observed from the inside of the OLED display to the first substrate.
Figure 5B:
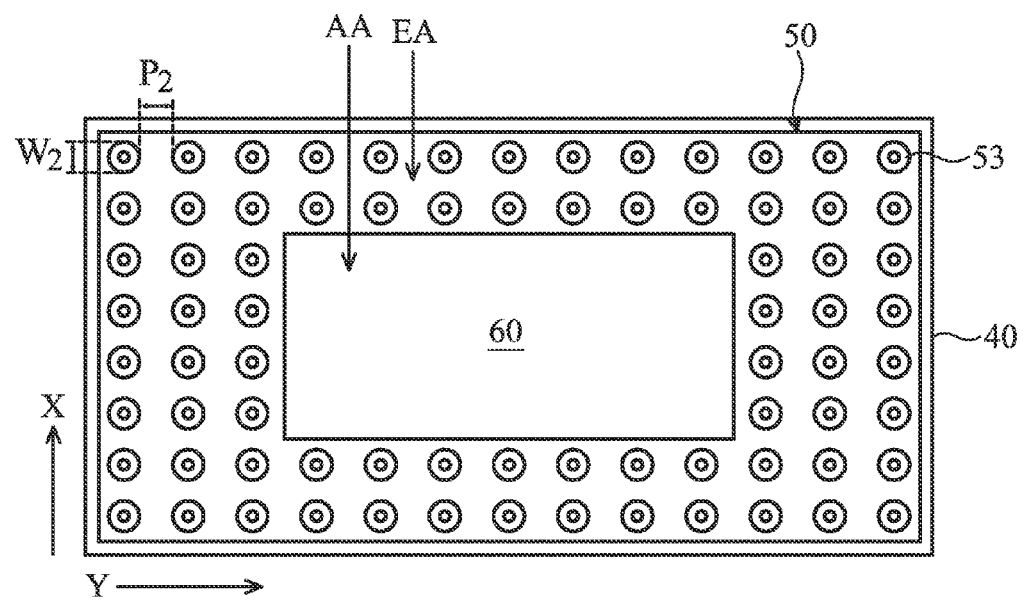
FIG. 5B shows a top view of partial elements of the OLED display of FIG. 2 observed from the inside of the OLED display to the second substrate.

Top views observed from the inner side of the OLED display 1 toward the first substrate 10 and second substrate 40 are shown in FIGS. 5A and 5B, respectively. After the completion of the fabrication process (FIGS. 3A and 3B) for the first substrate 10, the plurality of first protrusions 33 are arranged on a peripheral area of the color filter 20, as shown in FIG. 5A, and a pitch $P_1$ is formed between the bottoms of each two of the adjacent first protrusions 33, wherein the pitch $P_1$ is between a ranged from 10 μm to 30 μm, and the bottom of each of the first protrusions 33 has a maximum width $W_1$ which is between a range from 5 μm to 25 μm. Similarly, after the completion of the fabrication process (FIGS. 4A, 4B and 4C) for the second substrate 40, the plurality of the second protrusions 53, as shown in FIG. 5B, are arranged on a peripheral area of the OLEDs 60, and a pitch $P_2$ is between the bottoms of each two of the adjacent second protrusions 53, wherein the pitch $P_2$ is between a range from 10 μm to 30 μm, and the bottom of each of the second protrusions 53 has a maximum width $W_2$ which is between a range from 5 μμm to 25 μm.

Figure 6:
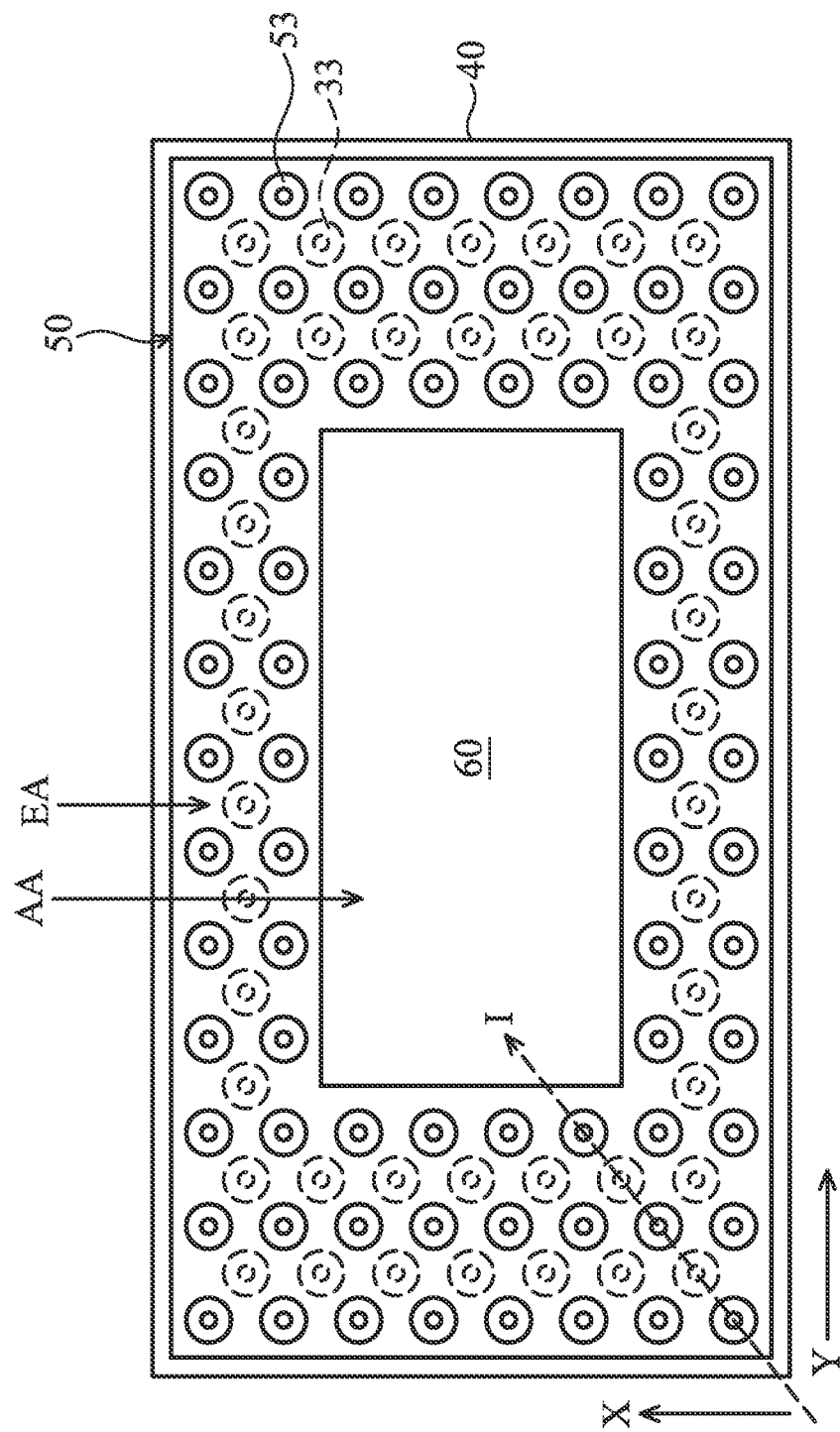
FIG. 6 shows a top view of partial elements of the OLED display of another embodiment observed from the inside of the OLED display to the second substrate.

The relative relationship of the first protrusions 33 and the second protrusions 53 will hereinafter be discussed in detail. Referring to both FIGS. 5A and 5B, in the embodiment, the first protrusions 33 and the second protrusions 53 are respectively arranged in rows in the vertical direction (X direction), and each row of the first protrusions 33 and each row of the second protrusions 53 are alternatively arranged in a transversal direction (Y direction). FIG. 6 depicts another arranged method of the first protrusions 33 and the second protrusions 53 in an alternative embodiment, wherein the first protrusions 33 are shown by a dash line for purposes of illustration. In the alternative embodiment, the first protrusions 33 and the second protrusions 53 are respectively arranged in rows in the vertical direction (X direction), and each of the rows of the first protrusions 33 and each of the rows of the second protrusions 53 are alternatively arranged along a predetermined direction I, wherein the predetermined direction I is between the vertical direction (X direction) and the transversal direction (Y direction). In the embodiment, a 45 degree angle is formed between the predetermined direction I and the transversal direction (Y direction), but it should not limited thereto. The angle between the predetermined direction I and the transversal direction (Y direction) may be modified according to demands.

It should be noted that in the above embodiments the cross-sectional shape of each of the first protrusions 33 or second protrusions 53 is circular, but it should not be limited thereto. In another embodiment, the cross-sectional shape of the first protrusions 33 and the second protrusions 53 may be trapezoidal, a rhombus, polygonal, a cruciform, or any combination thereof. On the other hand, to prevent interference from occurring between the first protrusions and the adjacent second protrusions, the maximum width $W_1$ of each of the first protrusions is less than the pitch $P_2$ between each two of the adjacent second protrusions, and the maximum width $W_2$ of each of the second protrusions is less than the pitch $P_1$ between each two of the adjacent first protrusions.

Figure 7:
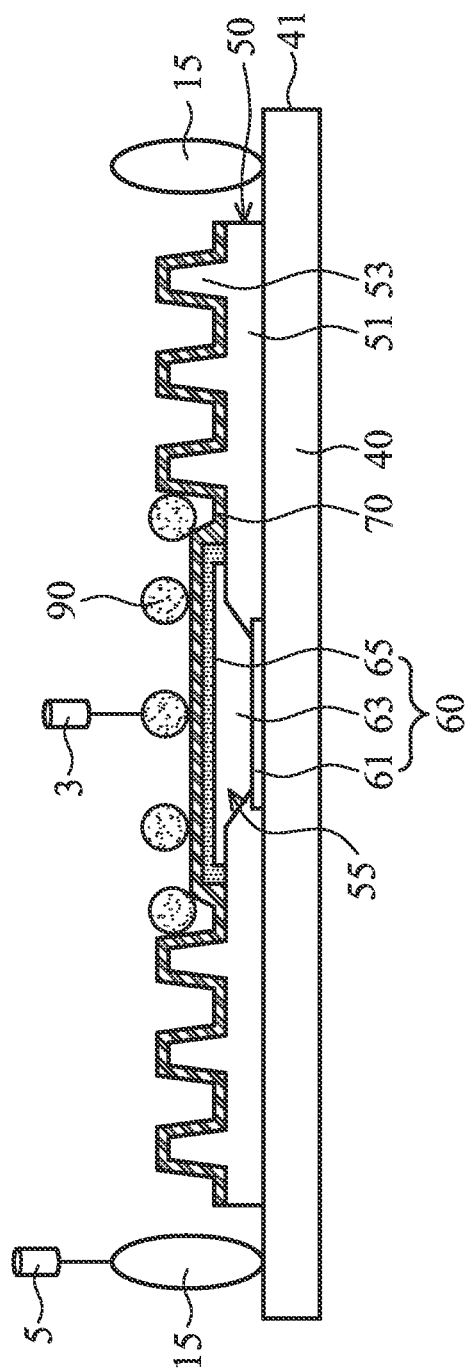
FIG. 7 is a schematic view showing the OLED display packaging process.
Figure 8:
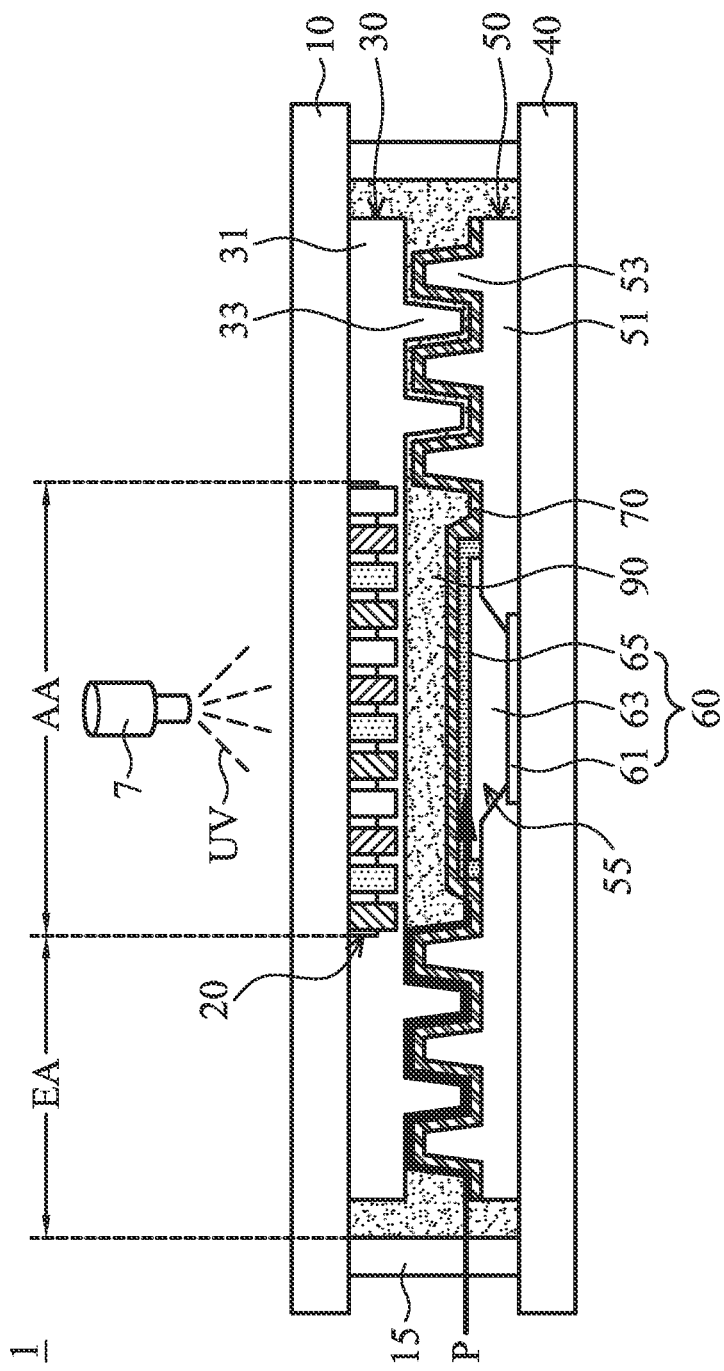
FIG. 8 shows a schematic view of the OLED display in accordance with one preferred embodiment of the present invention.

Referring to FIG. 7, prior to the assembly of the first substrate 10 and the second substrate 40, the sealant 15 is applied on an region of the second substrate 40 adjacent to the lateral side 41 of the second substrate 40 by a nozzle 5, and the filler 90 is dropped into the region surrounded by the sealant 15 with an ODF (one drop filling) process by a nozzle 3. Next, as shown in FIG. 8, the first substrate 10 and the second substrate 40 are combined with each other by CCD fine alignment techniques, such that each of the first protrusions 33 is located in the spaces between each two of the adjacent protrusions 53. Moreover, the filler 90 is cured by UV light produced by an apparatus 7. In another alternative embodiment, the filler 90 may include different materials which are cured without the projection of UV light. Thus, the environmental substances P have to pass through the slits formed between the first protrusions 33 and the second protrusions 53 before it enters the inside of the OLED display 1. Additionally, the slits formed between the first protrusions 33 and the second protrusions 53 are not directly directed to the OLEDs 60 and are filled with the filler 90, whereby the path which allows water to pass therethrough is elongated so as to create a low water/oxygen vapor transmission rate (WVTR/OTR) condition.

As a whole, in a direction from the outermost edge of the OLED display 1 to the display area AA, the OLED display 1 includes a plurality of first protrusions 33 and a plurality of second protrusions 53, wherein one of the first protrusions 33 or second protrusions 53 is adjacent to the outermost edge of the OLEDs 60, and the other one of the first protrusions 33 or second protrusions 53 is adjacent to the display area AA.

The OLED display of the present invention utilizes the incentive micro-structures to block environmental substances, thus providing a significant reduction in the water vapor transmission rate (WVTR) without being processed by a high cost laser device.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An OLED display, comprising:
    a first substrate, wherein a display area and a peripheral region surrounding the display area are defined on the first substrate;
    a second substrate, disposed opposite to the first substrate;
    an OLED, disposed on the second substrate;
    a first micro-structure layer, disposed between the first and second substrates and comprising an overcoat layer and a plurality of first protrusions corresponding to the peripheral region and disposed on the overcoat layer; and
    a second micro-structure layer, comprising a pixel defined layer and a plurality of second protrusions disposed on the pixel defined layer, wherein the overcoat layer and the pixel defined layer are arranged continuously extending from the display area to the peripheral region, and the first protrusions and second protrusions are alternately arranged.

2. The OLED display as claimed in claim 1, wherein each of the first protrusion protrudes along a direction away from the first substrate and has a tapered shape, and each of the second protrusion protrudes along a direction away from the second substrate and has a tapered shape.

3. The OLED display as claimed in claim 2, wherein an acute angle is formed between a lateral side of each of the first protrusion and a bottom side of the corresponding first protrusion, and the acute angle is less than 70 degrees.

4. The OLED display as claimed in claim 2, wherein an acute angle is formed between a lateral side of each of the second protrusion and a bottom side of the corresponding second protrusion, and the acute angle is less than 70 degrees.

5. The OLED display as claimed in claim 1, wherein a maximum width of each of the first and second protrusions is between a range from 5 μm to 25 μm.

6. The OLED display as claimed in claim 1, wherein a pitch between each two of the adjacent first protrusions is between a range of 10 μm to 30 μm, and a pitch between each two of the adjacent second protrusions is between a range of 10 μm to 30 μm.

7. The OLED display as claimed in claim 1, further comprising a passivation layer formed on the second micro-structure layer.

8. The OLED display as claimed in claim 1, wherein a height of each of the first and second protrusions is between a range from 1.5 μm to 7 μm.

9. The OLED display as claimed in claim 1, further comprising a sealant, connected between the first substrate and the second substrate, wherein the peripheral region of the first substrate is located at an inner side of the sealant.

10. The OLED display as claimed in claim 9, wherein the peripheral region of the first substrate comprising an area inwardly extending for a predetermined distance from a position at which the sealant is connected to the first substrate, wherein the predetermined distance is between a range from 0.5 cm to 1 cm.

11. The OLED display as claimed in claim 1, further comprising a plurality of OLEDs, wherein the second microstructure further comprises a plurality of pixel defined areas corresponding to the display area, and the OLEDs are disposed in the respective pixel defined areas.

12. The OLED display as claimed in claim 1, further comprising a color filter corresponding to the display area and disposed on an inner surface of the first substrate.

\* \* \* \* \*